(12) United States Patent
Nagata (10) Patent No.: US 8,804,395 B2
(45) Date of Patent: Aug. 12, 2014

(54) SEMICONDUCTOR DEVICE, CONTROL METHOD THEREOF AND DATA PROCESSING SYSTEM

(71) Applicant: Kyoichi Nagata, Tokyo (JP)

(72) Inventor: Kyoichi Nagata, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/147,692

(22) Filed: Jan. 6, 2014

(65) Prior Publication Data
US 2014/0119143 A1    May 1, 2014

Related U.S. Application Data

(63) Continuation of application No. 13/431,654, filed on Mar. 27, 2012, now Pat. No. 8,670,284.

(30) Foreign Application Priority Data

Mar. 28, 2011    (JP) ................... 2011-071052

(51) Int. Cl.
*G11C 5/06*    (2006.01)
*G11C 29/00*   (2006.01)
*G11C 5/02*    (2006.01)

(52) U.S. Cl.
CPC ............... *G11C 29/84* (2013.01); *G11C 29/848* (2013.01); *G11C 29/80* (2013.01); *G11C 29/81* (2013.01); *G11C 5/025* (2013.01)
USPC ............. 365/63; 365/200; 365/203; 365/204; 365/227

(58) Field of Classification Search
CPC ........ G11C 29/80; G11C 29/81; G11C 29/84; G11C 29/848; G11C 5/025
USPC ................. 365/63, 200, 203, 204, 227
See application file for complete search history.

(56) References Cited

U.S. PATENT DOCUMENTS

| | | | |
|---|---|---|---|
| 6,917,541 B2 * | 7/2005 | Shimbayashi et al. | ... 365/185.05 |
| 6,975,540 B2 * | 12/2005 | Kato | ........................... 365/185.2 |
| 7,411,846 B2 * | 8/2008 | Terzioglu | ...................... 365/200 |
| 7,460,388 B2 * | 12/2008 | Ilda | ................................. 365/63 |
| 7,859,914 B2 * | 12/2010 | Kawabata et al. | ........ 365/189.02 |

(Continued)

FOREIGN PATENT DOCUMENTS

JP    2007-287209 A    11/2007

OTHER PUBLICATIONS

Notice of Allowance issued Oct. 23, 2013 in parent U.S. Appl. No. 13/431,654.

*Primary Examiner* — Viet Q Nguyen
(74) *Attorney, Agent, or Firm* — Sughrue Mion, PLLC (57) ABSTRACT

Disclosed herein is a semiconductor device comprising a global bit line, a first local bit line coupled to normal memory cells, a second local bit line coupled to redundant memory cells first and second hierarchical switches, a precharge circuit precharging the global bit line, a redundancy determination circuit determining whether or not an accessed address matches a defective address, and a control circuit. In a standby state, the global bit line and the second local bit line are precharged through the second hierarchical switch. In an active state, the first local bit line is precharged through the first hierarchical switch, subsequently when the redundancy determination circuit determines that the addresses do not match, the second hierarchical switch is inactivated to access the normal memory cells, and when the redundancy determination circuit determines that the addresses match each other, the first hierarchical switch is inactivated to access the redundant memory cells.

7 Claims, 8 Drawing Sheets

(56) References Cited

U.S. PATENT DOCUMENTS

| | | |
|---|---|---|
| 8,023,319 B2 * | 9/2011 | Cho et al. ............... 365/163 |
| 8,139,415 B2 * | 3/2012 | Kim ..................... 365/185.13 |
| 8,472,272 B2 * | 6/2013 | Kajigaya ................ 365/203 |
| 8,520,449 B2 * | 8/2013 | Kajigaya ............. 365/189.04 |
| 8,670,284 B2 * | 3/2014 | Nagata .................. 365/203 |
| 2011/0134678 A1 * | 6/2011 | Sato et al. ............... 365/63 |

* cited by examiner

SEMICONDUCTOR DEVICE, CONTROL METHOD THEREOF AND DATA PROCESSING SYSTEM

This application is a Continuation of application Ser. No. 13/431,654, filed Mar. 28, 2012, which is based on Japanese Patent Application No. 2011-071052 filed on Mar. 28, 2011, the disclosures of which are incorporated herein by reference in their entirety.

BACKGROUND OF THE INVENTION

1. Field of the Invention

The present invention relates to a semiconductor device comprising a memory cell array having a hierarchical bit line structure in which there are redundant memory cells for replacing normal memory cells that are defective, and relates to a control method thereof and a data processing system comprising the semiconductor device.

2. Description of Related Art

In semiconductor memory devices of recent years such as a DRAM, an increase in capacity and a reduction in size have been achieved, which causes the number of memory cells on a bit line to increase. In order to deal with this performance problem, hierarchical bit lines including global bit lines and local bit lines tend to be employed. In general, the hierarchical bit lines are provided with hierarchical switches controlling connections between the global bit lines and the local bit lines. In this kind of the hierarchical bit lines, when sense amplifiers are connected to one ends of the global bit lines, it is necessary to previously precharge the global bit lines and the local bit lines to a common potential prior to accessing memory cells. In this case, if a precharge circuit is provided for each of a large number of local bit lines for one global bit line, a circuit scale thereof increases. Therefore, by appropriately controlling the hierarchical switches, a precharge circuit for the global bit line is desired to be commonly used in a precharge operation of the local bit lines. For example, Patent Reference 1 discloses a control method of the hierarchical switches that enable precharging the local bit lines using the precharge circuit for the global bit line in a memory cell array having the hierarchical bit lines.

[Patent Reference 1] Japanese Patent Application Laid-open No. 2007-287209 (U.S. Pat. No. 7,460,388)

A semiconductor device of large capacity such as a DRAM is generally provided with redundant memory cells for replacing normal memory cells for the purpose of repairing defective memory cells. If a redundant region including the normal memory cells and the redundant memory cells is formed in the above memory cell array having the hierarchical bit lines, there is provided a redundancy determination circuit for determining whether or not an address of an access target is a defective address when accessing a memory cell. Therefore, an operation procedure is necessary in which a hierarchical switch corresponding to the precharge operation of the hierarchical bit lines to be accessed is controlled after waiting for a determination result of the redundancy determination circuit when accessing a normal memory cell. Since it takes a relatively long time to obtain the determination result of the redundancy determination circuit, there is a risk that driving timing of a word line or a redundant word line may be delayed after the precharge operation of the hierarchical bit lines is completed, thereby decreasing access speed. Meanwhile, all hierarchical bit lines (a plurality of local bit lines corresponding to one global bit line) can be previously precharged in a standby state in order to shorten the time required to control the hierarchical switches. However, this control is not desired since an increase in consumption current of the semiconductor device is inevitable. Further, bringing a plurality of hierarchical switches corresponding to the plurality of local bit lines that are not to be accessed into a non-selected state is not desired in a viewpoint of the consumption current. In this manner, when the redundant region is formed in the memory cell array having the conventional hierarchical bit lines, there is a problem that it is difficult to keep a high access speed when accessing the memory cells without increasing the consumption current.

SUMMARY

A semiconductor device according to an embodiment of the disclosure comprises: a global bit line; a first local bit line to which normal memory cells are connected, the first local bit line corresponding to the global bit line; a first hierarchical switch controlling an electrical connection between the global bit line and the first local bit line; a second local bit line to which redundant memory cells replacing at least the normal memory cells are connected, the second local bit line corresponding to the global bit line; a second hierarchical switch controlling an electrical connection between the global bit line and the second local bit line; a precharge circuit precharging the global bit line to a predetermined voltage; a precharge circuit precharging the global bit line to a predetermined voltage; a redundancy determination circuit determining whether or not an address specifying a memory cell to be accessed matches a defective address; and a control circuit controlling operations of the normal memory cells, the redundant memory cells, the precharge circuit and the redundancy determination circuit. In the semiconductor device, the control circuit performs an operation in a standby state, in which the precharge circuit and the second hierarchical switch are activated so that the global bit line and the second local bit line are precharged to the predetermined voltage, and the first hierarchical switch is inactivated so that the first local bit line is brought into a floating state, and the control circuit performs an active operation to access the normal memory cells, in which the first hierarchical switch is activated before receiving a determination result of the redundancy determination circuit so that the first local bit line is precharged to the predetermined voltage, subsequently when the determination result indicates that the addresses do not match each other, the first hierarchical switch is maintained active while the second hierarchical switch that has been active is inactivated and the precharge circuit is inactivated so as to access the normal memory cells, and when the determination result indicates that the addresses match each other, the first hierarchical switch that has been active is inactivated and the precharge circuit is inactivated so as to access the redundant memory cells.

DETAILED DESCRIPTION OF THE PREFERRED EMBODIMENTS

It is apparent that the present invention is not limited to embodiments described below, but should be construed based on the disclosure of the claims.

Figure 1:
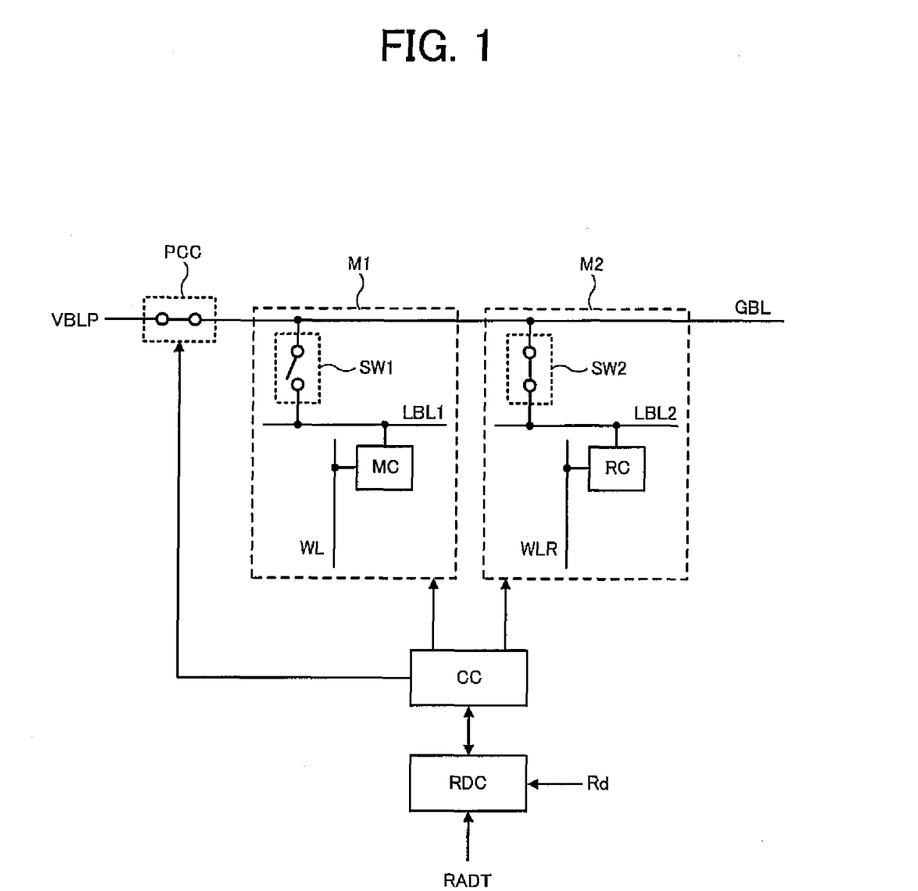
FIG. 1 is a diagram showing an embodiment of the invention.

As shown in FIG. 1, an embodiment of the invention is a semiconductor device comprising a memory cell array having hierarchical bit lines. FIG. 1 shows a range including one global bit line GBL and corresponding two local bit lines LBL that form a hierarchical bit line structure. A memory region M1 as the normal region includes a normal memory cell MC (hereinafter, referred to simply as "memory cell MC") selected by a word line WL, hierarchical bit lines including the global bit line GBL and a local bit line LBL1, and a hierarchical switch SW1 controlling an electrical connection between the global bit line GBL and the local bit line LBL1. A memory region M2 including the redundant region includes a redundant memory cell RC selected by a redundant word line WLR, hierarchical bit lines including the global bit lines GBL and a local bit line LBL2, and a hierarchical switch SW2 controlling an electrical connection between the global bit line GBL and the local bit line LBL2. A precharge circuit PCC is a circuit that precharges the global bit lines GBL to a voltage VBLP.

Meanwhile, a redundancy determination circuit RDC determines whether or not a row address RADT as an access target matches a previously stored defective address Rd. A control circuit CC controls operations of the memory regions M1, M2, the precharge circuit PCC, and the redundancy determination circuit RDC. In a standby state, the global bit line GBL is previously precharged to the voltage VBLP by the precharge circuit PCC under the control of the control circuit CC, and the hierarchical switch SW2 is turned on in this state so that the local bit line LBL2 is also precharged to the voltage VBLP. On the other hand, the hierarchical switch SW1 is OFF, and the local bit line LBL1 in the memory region M1 is brought into a floating state. Since the voltage of the redundant word line WL allows disconnecting the redundant memory cell RC from the local bit line LBL2, destruction of data of the redundant memory cell RC does not occur.

Subsequently, when accessing the memory region M1, the hierarchical switch SW1 is turned on so that the local bit line LBL1 is immediately precharged to the voltage VBLP. The redundancy determination circuit RDC determines whether or not the row address RADT to be accessed matches the defective address Rd and outputs its determination result after a predetermined time elapses in parallel with precharging the local bit line LBL1. Then, if the determination result shows that they match each other (accessing the redundant memory cell RC instead of the normal memory cell MC), the hierarchical switch SW1 is changed from ON to OFF again so that the redundant memory cell RC is accessed (at least the redundant word line WLR is activated) through the other hierarchical switch SW2 in an ON state. On the other hand, if the determination result shows that they do not match (accessing the normal memory cell MC), the hierarchical switch SW1 is kept ON so that the redundant memory cell RC is accessed through the other hierarchical switch SW2 in the ON state. In this manner, when transitioning from the standby state to an active operation, the precharge operation of the local bit line LBL1 to be accessed can be rapidly performed without waiting for the determination result of the redundancy determination circuit RDC. Therefore, it is possible to reliably prevent a decrease in access speed, and precharge circuits for the local bit lines LBL1 and LBL2 are not necessarily provided, thereby reducing a circuit scale. Although FIG. 1 shows the example in which the memory region M2 includes the redundant memory cell RC, the memory region M2 may include a normal memory cell MC in addition to the redundant memory cell RC.

Further, if a memory cell array is formed by a plurality of memory regions M1 and the memory region M2 including the redundant region, which is not shown in FIG. 1, the hierarchical switch SW1 in one memory region M1 to be accessed is controlled in the above-described manner, and hierarchical switches SW1 in remaining memory regions M1 not to be accessed are controlled to remain in the standby state. That is, the hierarchical switches SW1 in the remaining memory regions M1 not to be accessed are kept OFF in both the standby state and the active operation. Thus, a plurality of local bit lines LBL1 in the remaining memory regions M1 not to be accessed are not precharged. Accordingly, the consumption current does not occur due to the hierarchical switches SW1 and the local bit lines LBL1 in the remaining memory regions M1 not to be accessed.

Further, if the memory region M2 includes a normal memory cell MC to be accessed, the plurality of hierarchical switch SW1 in memory regions M1 not to be accessed are not switched and corresponding local bit lines LBL1 are not precharged, and thereby corresponding consumption current does not occur.

Further embodiments will be described in detail below with reference to accompanying drawings. In the following embodiments, the present invention is applied to a DRAM (Dynamic Random Access Memory) having the hierarchical bit lines as an example of the semiconductor device.

Figure 2:
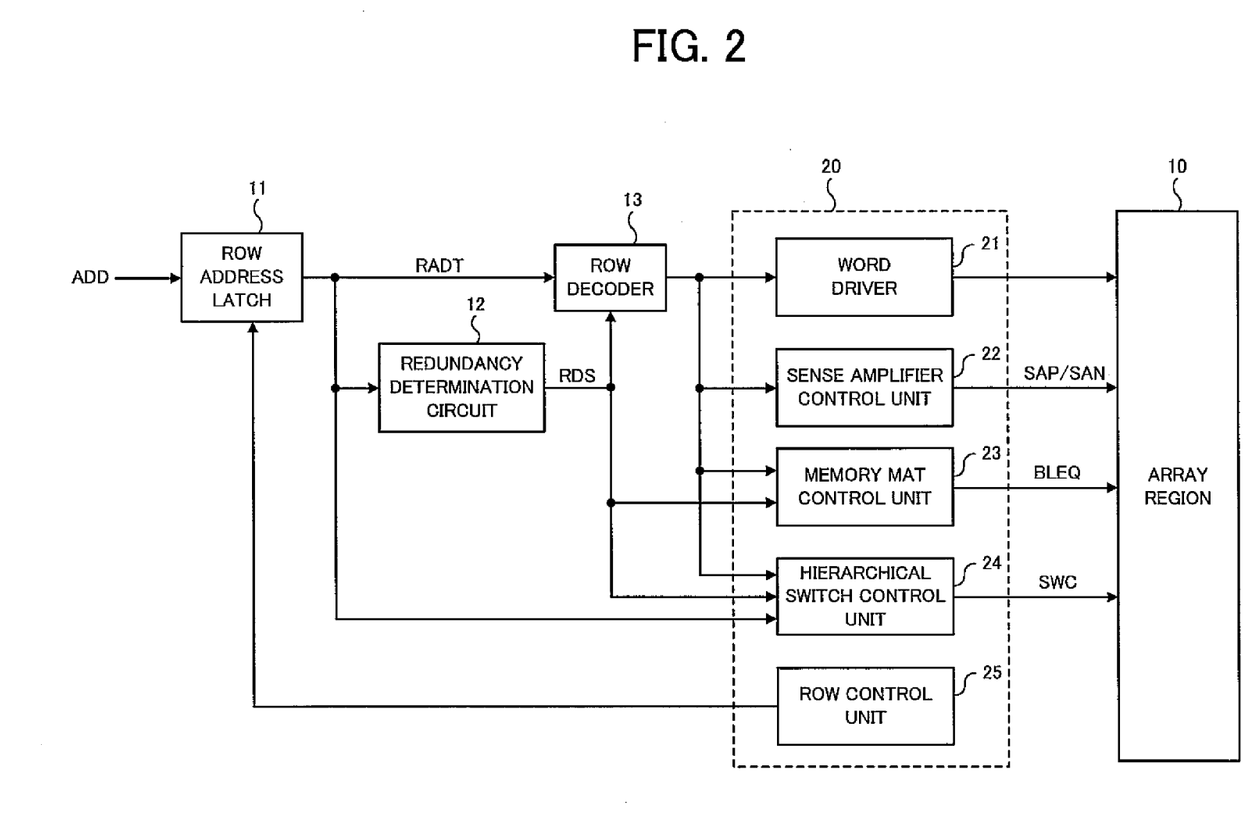
FIG. 2 is a block diagram schematically showing a configuration of a DRAM of an embodiment.
Figure 3:
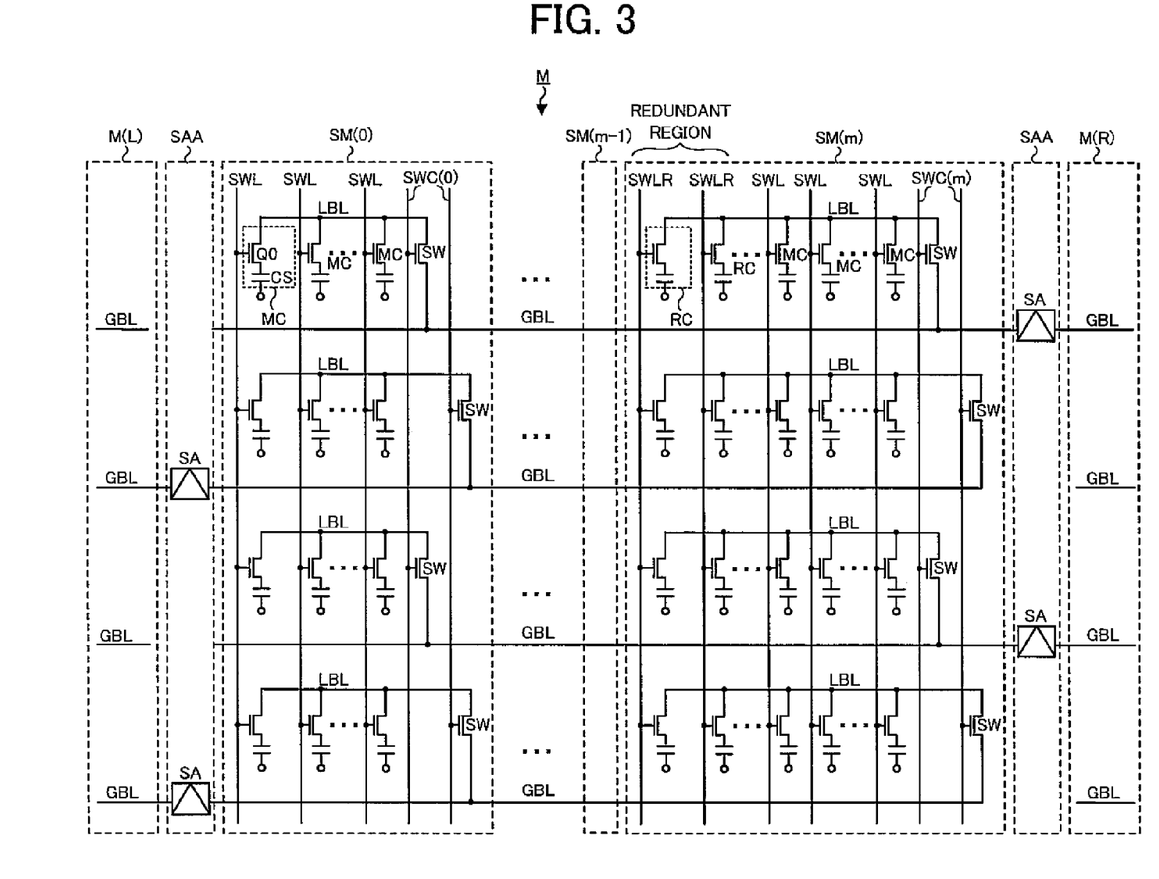
FIG. 3 is a diagram showing a partial configuration of an array region in the DRAM of the embodiment.

FIGS. 2 and 3 are a block diagram schematically showing a configuration of the DRAM of an embodiment and a detailed diagram of its part. The DRAM shown in FIG. 2 includes hierarchical bit lines (global bit lines GBL and local bit lines LBL of FIG. 3) and hierarchical word lines (main word lines MWL (not shown) and sub-word lines SWL of FIG. 3), and there is provided an array region 10 (FIG. 2) including a large number of memory cells MC (FIG. 3) arranged at intersections of the local bit lines LBL and the sub-word lines SWL. The main word lines MWL does not directly contribute to the invention and thus they are omitted. The array region 10 includes a plurality of memory mats M, M(L) and M(R) (FIG. 3) each as a unit area, and the unit area includes a normal region (the memory region M1 of FIG. 1) and a redundant region (the memory region M2 of FIG. 1) for repairing, which will be described in detail later. Further, the array region 10 includes circuits associated with the memory cells MC. For example, there are provided the circuits including hierarchical switches SW (FIG. 3) corresponding to the hierarchical bit lines, sense amplifiers SA (FIG. 3) each connected to one end of each global bit line GBL, and other circuits not shown in the figures. The hierarchical switches SW correspond to the hierarchical switches SW1 and SW2 in FIG. 1.

FIG. 2 shows a row address latch 11, a redundancy determination circuit 12, a row decoder 13, and a control circuit 20 in addition to the array region 10. Here, FIG. 2 mainly shows row circuits in a configuration of the DRAM, and column circuits from the sense amplifiers SA to external data terminals (not shown) and other circuits are omitted. The row address latch 11 receives an address signal ADD supplied from outside, for example, and outputs the row address RADT under control of a row control unit 25 included in the control circuit 20. The row address RADT is sent to the redundancy determination circuit 12, the row decoder 13, and a hierarchical switch control unit 24 in the control circuit 20. The row control unit 25 also controls a word driver 21, a sense amplifier control unit 22, a memory mat control unit 23, and the hierarchical switch control unit 24.

The redundancy determination circuit 12 determines whether or not a corresponding normal memory cell MC in the normal region should be replaced with a redundant memory cell RC in the redundant region based on the received row address RADT. In the redundancy determination circuit 12, information of defective addresses for specifying defective cells that need to be repaired is previously stored, for example, in fuse elements (not shown) or the like. The redundancy determination circuit 12 compares the row address RADT with the stored defective addresses, and outputs a redundancy determination signal RDS indicating a comparison result to the row decoder 13, the memory mat control unit 23 and the hierarchical switch control unit 24. The redundancy determination signal RDS indicates a hit state (for example, a high level) when the row address RADT matches the defective address, and indicates a mishit state (for example, a low level) when the row address RADT does not match the defective addresses.

The row decoder 13 receives the row address RADT and the redundancy determination signal RDS, and selects a word line WL (sub-word line SWL) included in the normal region to be accessed or the redundant region via the word driver 21 in the array region 10. Here, a sub-word line SWL is selected via a main word line MWL. When the redundancy determination signal RDS indicates the mishit state, the normal region in the array region 10 is selected as an access target, and when the redundancy determination signal RDS indicates the hit state, the redundant region in the array region 10 is selected to be used for repairing. The row decoder 13 further sends control signals to the word driver 21, the sense amplifier control unit 22, the memory mat control unit 23 and the hierarchical switch control unit 24 respectively that are included in the control circuit 20. That is, the memory mats M, M(L) and M(R) and sub-mats SM(0) to SM(m) therein are respectively selected by the row decoder 13 in accordance with the row address RADT and the redundancy determination signal RDS. This is because that the word driver 21, the sense amplifier control unit 22 and the memory mat control unit 23 are respectively controlled as a unit including each of the sub-mats SM(0) to SM(m). The word driver 21 controls the hierarchical word lines corresponding to the memory mats M in the array region 10, the sense amplifier control unit 22 controls potentials of sense amplifier driving lines SAP and SAN supplied to the respective sense amplifiers SA corresponding to the memory mats M, and the memory mat control unit 23 controls a later-described bit line equalizing signal BLEQ corresponding to the memory mats M in the array region 10.

Meanwhile, the hierarchical switch control unit 24 included in the control circuit 20 sends switch control signals SWC for controlling connection states of the hierarchical switches SW corresponding to the memory mats M and the sub-mats SM in the array region 10 based on the row address RADT from the row address latch 11 and the redundancy determination signal RDS from the redundancy determination circuit 12. The control of the control signals SWC by the hierarchical switch control unit 24 varies depending on whether or not the redundant region is included in a control target, which will be described in detail later.

Next, FIG. 3 is a diagram showing a partial configuration of the array region 10 in the DRAM of the embodiment. FIG. 3 shows a plurality of memory mats M as a partial region of the array region 10 of FIG. 2 and sense amplifier arrays SAA arranged on both sides of each memory mat M. Each memory mat M is partitioned into m+1 sub-mats SM aligned in an extending direction of the global bit lines GBL. Hereinafter, each of the sub-mats SM of the memory mats M is represented with an appropriate number, and FIG. 3 shows sub-mats SM(0) to SM(m) from the left end. Among these, there are m sub-mats SM(0) to SM(m−1), which may be referred to as "normal sub-mats SM(0) to SM(m−1)" hereinafter, including only a plurality of normal memory cells MC as the normal region, and one sub-mat SM(m), which may be referred to as "redundant sub-mat SM(m)" hereinafter, including both the normal region and a plurality of redundant memory cells RC as the redundant region. Here, the normal memory cells MC and the redundant memory cells RC are memory cells for row circuits associated with the global bit lines GBL and the local bit lines LBL, each of which is assigned a corresponding external address. FIG. 3 does not show redundant memory cells for column circuits associated with a so-called column redundancy including redundant global bit lines and redundant local bit lines. In other words, each of the sub-mats SM(0) to SM(m) may include the redundant memory cells for the column circuits, and corresponding redundant global bit lines, redundant local bit lines and redundant sense amplifiers. This is because that the column redundancy is not directly related to effects of the embodiments. That is, the effects of the embodiments are characterized by the normal sub-mats SM(0) to SM(m−1) and the redundant sub-mat SM(m) that specify whether or not the redundant memory cell for the row circuits exist, since features thereof include the control of the hierarchical switches SW and the like and the control circuit performing the control.

In addition, the normal sub-mats SM(0) to SM(m−1) correspond to a first memory region, and the redundant sub-mat SM(m) corresponds to a second memory region. Although, in the example of FIG. 3, there is provided the redundant sub-mat SM(m) at one end in the memory mat M, an arbitrary sub-mat SM in the memory mat M can be used as the redundant sub-mat.

As described above, the bit line structure of the memory mat M is hierarchized into the global bit lines GBL and the local bit lines LBL. Each of the global bit lines GBL extends over the m+1 sub-mats SM in the memory mat M. The global bit lines GBL are alternately connected to the sense amplifiers SA included in the sense amplifier arrays SAA on both sides in their arrangement order (zigzag arrangement). In addition, the memory mat M shown in FIG. 3 has an open bit line structure. The memory mat M(L) is arranged on the left of the memory mat M via one sense amplifier array SAA, and the memory mat M(R) is arranged on the right of the memory mat M via the other sense amplifier array SAA. Each sense amplifier SA has a differential configuration that amplifies a signal voltage transmitted through the global bit line GBL. A specific configuration of the sense amplifier SA will be described later. Although the global bit lines GBL on both sides of the sense amplifier array SAA have the same symbol (GBL), the embodiment employs the open bit line structure and therefore one of the global bit lines GBL electrically corresponds to so-called "true" (a later-described global bit line GBL(L) in FIG. 4) and the other thereof corresponds to so-called "bar" (a later-described global bit line GBL (R) in FIG. 4).

In each sub-mat SM, the local bit lines LBL whose number is the same as the global bit lines GBL are arranged. That is, m+1 local bit lines LBL aligned on the same straight line correspond to each one of the global bit lines GBL. Thus, when L global bit lines GBL are arranged in the entire memory mat M, Lx(m+1) local bit lines LBL are arranged therein. Thereby, the length of each local bit line LBL is shortened to 1/(n+1) of the length of each global bit line GBL.

Further, the word line structure of the memory mat M is hierarchized into main word lines MWL and sub-word lines SWL. However, FIG. 3 shows only the sub-word lines SWL, and the main word lines MWL are omitted. A predetermined number of sub-word lines SWL are arranged in each of the normal sub-mats SM(0) to SM(m−1). Meanwhile, two redundant sub-word lines SWLR are arranged in the redundant sub-mat SM(m), in addition to the predetermined number of sub-word lines SWL. A plurality of memory cells MC (the normal memory cells) are arranged at intersections of the local bit lines LBL and the sub-word lines SWL in all the sub-mats SM. Meanwhile, a plurality of redundant memory cells RC are arranged at intersections of the local bit lines LBL and the two redundant sub-word lines SWLR in the redundant region of the redundant sub-mat SM(m). Each of the normal memory cells MC and the redundant memory cells RC is composed of a selection transistor Q0 selectively switched by a corresponding sub-word line SWL or a corresponding redundant sub-word line SWLR, and a capacitor CS storing data as electric charge of a data storage node.

Further, in each sub-mat SM, there is provided a plurality of hierarchical switches SW arranged at one ends of the local bit lines LBL. Each hierarchical switch SW is an NMOS-type transistor (field-effect transistor) controlling an electrical connection between the global bit line GBL and the local bit line LBL in response to either potential of two lines for the switch control signal SWC applied through one of the two lines to its gate. In the memory mat M of FIG. 3, there are the hierarchical switches SW whose number is the same as the local bit lines LBL. Although, in the example of FIG. 3, two lines for a switch control signal SWC(0) are arranged in parallel in the sub-mat SM(0) and two lines for a switch control signal SWC(m) are arranged in parallel in the sub-mat SM(m), it is possible to employ a configuration in which one line for the switch control signal SW is arranged in each sub-mat SM. Further, the hierarchical switches SW may be arranged at the center of the local bit lines LBL. Furthermore, a plurality of hierarchical switches SW may be arranged on each local bit line LBL.

Figure 4:
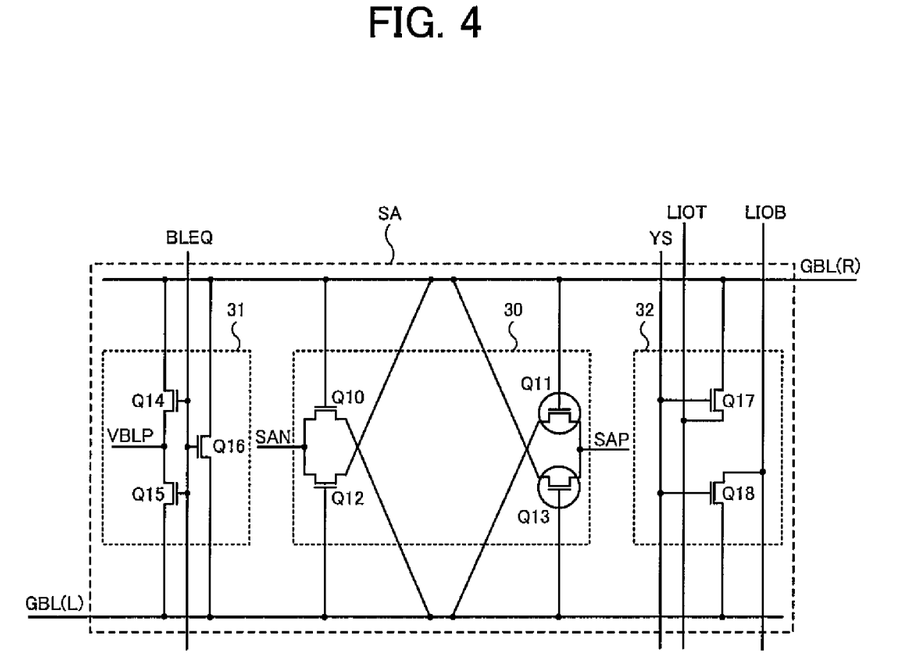
FIG. 4 is a diagram showing a circuit configuration example of a sense amplifier in a sense amplifier array of FIG. 3.

FIG. 4 shows a circuit configuration example of the sense amplifier SA in the sense amplifier array SAA of FIG. 3. The sense amplifier SA shown in FIG. 4 is connected to one global bit line GBL(R) in the memory mat M on the right and to one global bit line GBL(L) in the memory mat M on the left, and a pair of the global bit lines GBL(L) and GBL(R) form a complementary pair. The sense amplifier SA includes a cross coupled circuit 30, a precharge/equalize circuit 31, an input/output port 32 and a pair of local input/output lines LIOT and LIOB for the column circuits.

In the cross coupled circuit 30, a pair of transistors Q10 (NMOS) and Q11 (PMOS) forming one inverter have gates connected to the global bit line GBL(R) and a pair of transistors Q12 (NMOS) and Q13 (PMOS) forming the other inverter have gates connected to the global bit line GBL(L). Each of the inverters functions as a latch circuit in which inputs and outputs thereof are cross-coupled to each other. The cross coupled circuit 30 is a voltage differential amplifier being driven by a pair of sense amplifier driving lines SAP and SAN (FIG. 2) and latching a voltage difference between the global bit lines GBL(R) and GBL(L) in binary form.

The precharge/equalize circuit 31 corresponds to the precharge circuit PCC of FIG. 1 and includes three NMOS transistors Q14, Q15 and Q16 having gates to which the bit line equalizing signal BLEQ is applied. The NMOS transistors Q14 and Q15 function as a precharge circuit that precharges the global bit lines GBL(R) and GBL(L) to the precharge voltage VBLP as the predetermined voltage when the bit line equalizing signal BLEQ is at a high level. The NMOS transistor Q16 functions as an equalize circuit that equalizes the pair of global bit lines GBL(R) and GBL(L) when the bit line equalizing signal BLEQ is at the high level.

The input/output port 32 is a control circuit for the column circuits, which includes a pair of transistors Q17 and Q18 (NMOS) controlling electrical connections between the global bit lines GBL(L) and GBL(R) and the local input/output lines LIOT and LIOB in response to a potential of a column select line YS connected to gates thereof. The column select line YS transmits a signal generated from the externally received address signal ADD via a column address latch and a column decoder. When the column select line YS is set to a high level, the global bit line GBL (R) is connected to the local input/output line LIOT through the transistor Q17, and the global bit line GBL(L) is connected to the local input/output line LIOB through the transistor Q18.

As shown in FIGS. 3 and 4, each global bit line GBL is precharged to the precharge voltage VBLP by the precharge/equalize circuit 31 in the sense amplifier SA. However, a different precharge circuit is not provided specifically for precharging each local bit line LBL. The embodiment employs a configuration for precharging the local bit line LBL from the global bit line GBL through the hierarchical switch SW, and a specific control will be described in detail later. In this manner, by utilizing the precharge/equalize circuit 31 for the global bit lines GBL without providing precharge circuits for the local bit lines LBL, it is possible to reduce an area of the array region 10 since the precharge circuits for the local bit lines LBL whose number is larger than the global bit lines GBL need not to be provided.

Figure 5:
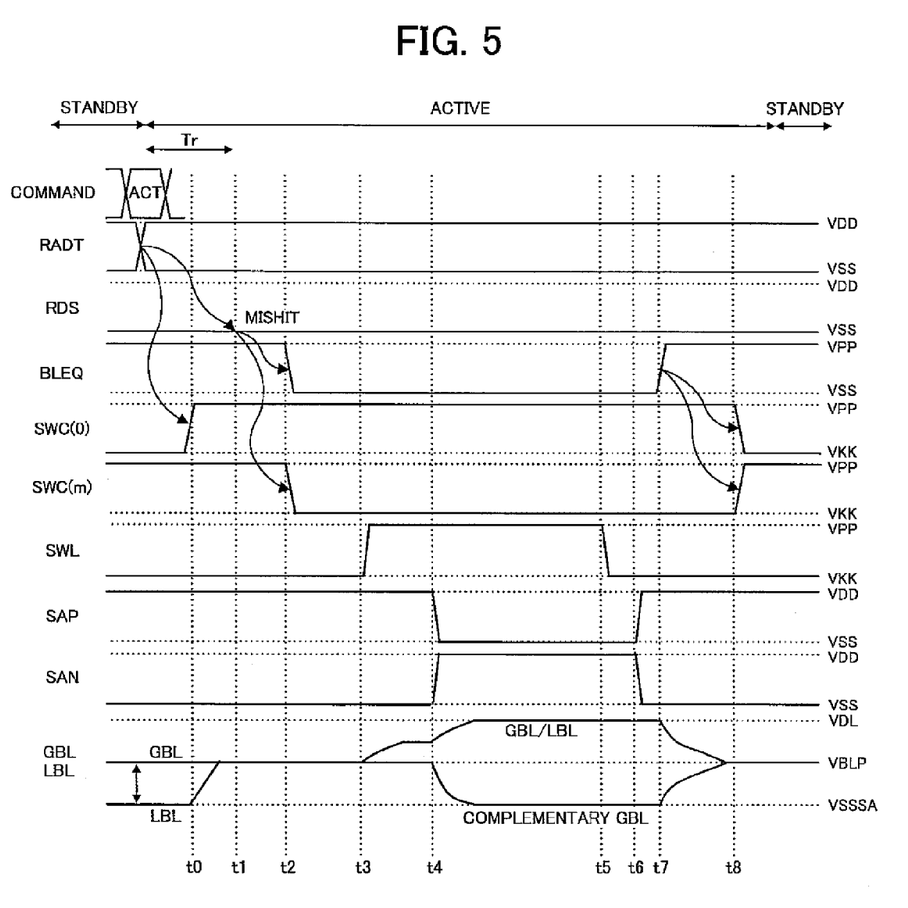
FIG. 5 is a diagram showing operation waveforms when a normal sub-mat SM(0) of a memory mat M of FIG. 3 is selected as an access target and a redundancy determination signal indicates a mishit state.
Figure 6:
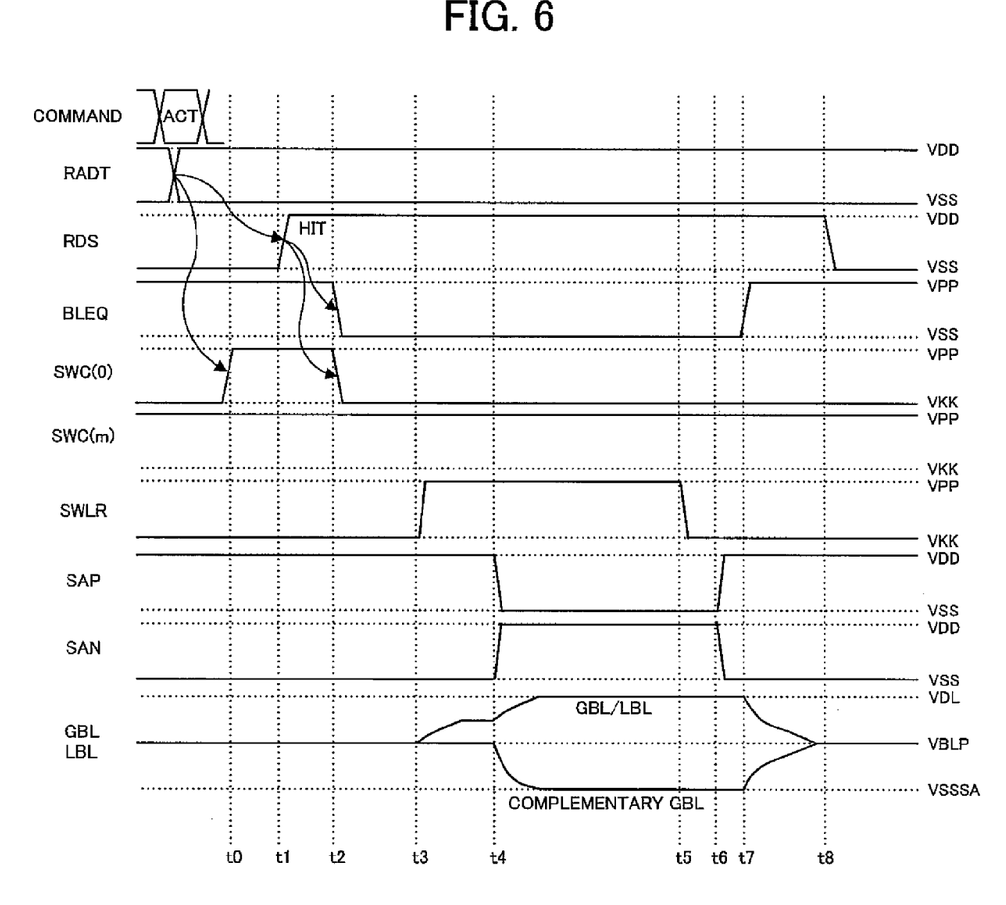
FIG. 6 is a diagram showing operation waveforms when a normal sub-mat SM(0) of the memory mat M of FIG. 3 is selected as the access target and the redundancy determination signal indicates a hit state.
Figure 7:
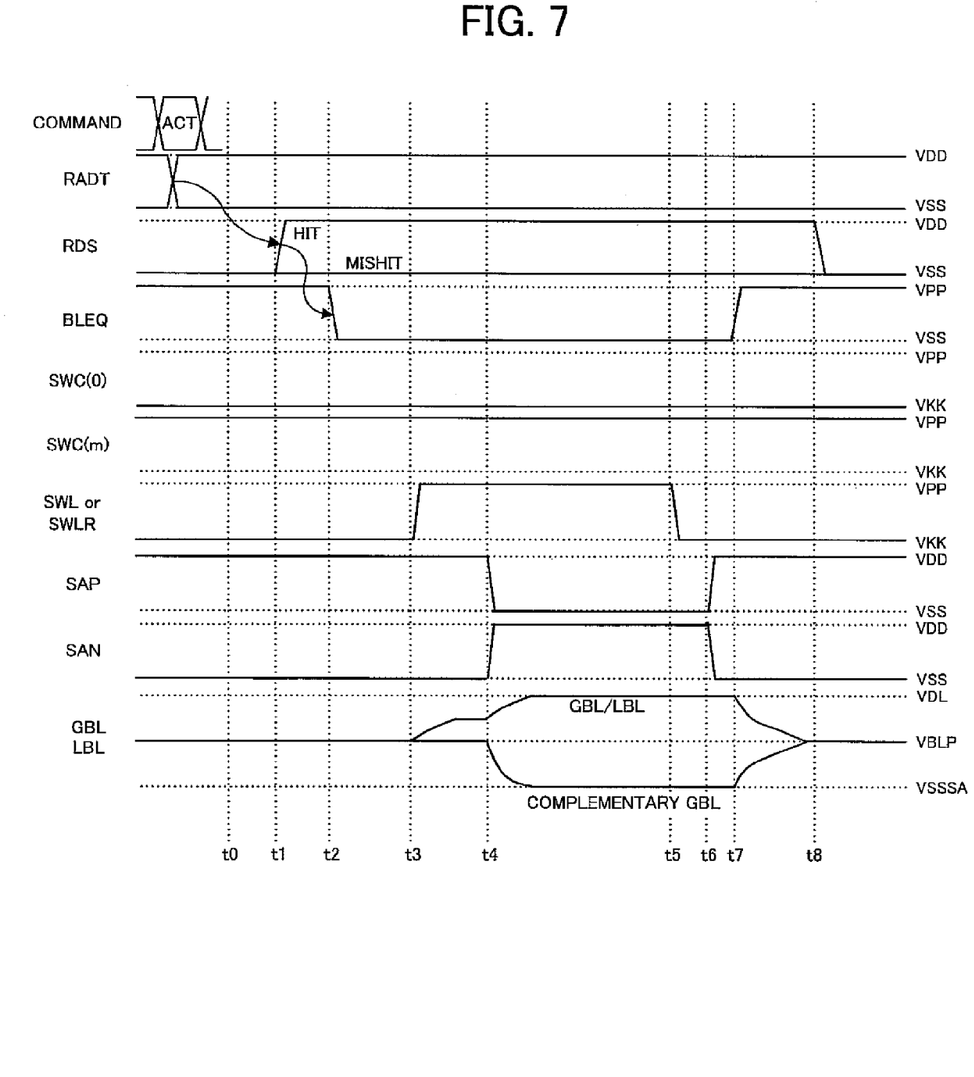
FIG. 7 is a diagram showing operation waveforms when a redundant sub-mat SM(m) of the memory mat M of FIG. 3 is selected as the access target.

Next, an operation of the DRAM of the embodiment will be described with reference to FIGS. 5 to 7. FIGS. 5 to 7 shows three types of operation waveforms in a read operation in accordance with states of the row address RADT and the redundancy determination signal RDS of FIG. 2. For example, a high level of the row address RADT, the redundancy determination signal RDS, and the sense amplifier driving lines SAP and SAN is a power supply voltage VDD while a low level thereof is a ground potential VSS, in the operation waveforms of FIGS. 5 to 7. For example, a high level of the bit line equalizing signal BLEQ is a positive voltage VPP (VPP>VDD) while a low level thereof is the ground potential VSS. For example, a high level of the switch control signals SWC and the sub-word line SWL to be accessed is the positive voltage VPP while a low level thereof is a negative voltage VKK (VKK<VSS). For example, a high level of the global bit lines GBL and the local bit lines LBL is a power supply voltage VDL while a low level thereof is a ground potential VSSSA, and an intermediate voltage between the power supply voltage VDL and the ground potential VSSSA is the precharge voltage VBLP.

FIG. 5 shows operation waveforms when the normal sub-mat SM(0) of the memory mat M of FIG. 3 is selected as an access target by the row address RADT and the redundancy determination signal RDS indicates a mishit state (non-redundancy). The DRAM is in a standby state at an early point of FIG. 5 so that the bit line equalizing signal BLEQ is at the high level. Therefore, the global bit line GBL has been precharged to the precharge voltage VBLP by the precharge/equalize circuit 31 in the sense amplifier SA. The switch control signals SWC(0) to SWC(m−1) for the respective normal sub-mats SM(0) to SM(m−1) are maintained at the low level as an inactive state. The respective local bit lines LBL in the normal sub-mats SM(0) to SM(m−1) have been disconnected from the global bit line GBL. Thus, the local bit lines LBL in the normal sub-mats SM(0) to SM(m−1) are in a floating state. In addition, the two lines for the switch control signal SWC(0) in the normal sub-mat SM(0) of FIG. 3 are always controlled in the same way as each other, and the same may go for other sub-mats SM. In the standby state, the local bit line LBL to be accessed is in the floating state, which is maintained, for example, at the low level (the ground potential VSSSA). However since the sub-word line SWL to be accessed is at the negative voltage VKK as a non-selected state, data of a memory cell MC to be accessed is not destroyed.

On the other hand, as to the redundant sub-mat SM(m) in the standby state, the switch control signal SWC(m) for the redundant sub-mat SM(m) has been activated to the high level. At this point, since the global bit line GBL has been precharged to the precharge voltage VBLP, the local bit line LBL of the redundant sub-mat SM(m) continues to be precharged to the precharge voltage VBLP from the global bit line GBL through the corresponding hierarchical switch SW.

Subsequently, an active command ACT is issued, and the row address RADT specifying the access target is received at the same time. Thereafter, the switch control signal SWC(0) for the normal sub-mat SM(0) to be accessed is activated to the high level at a time t0. As a result, the precharge voltage VBLP at which the global bit line GBL is maintained is supplied to the local bit line LBL of the normal sub-mat SM(0) through the hierarchical switch SW. Since other normal sub-mats SM(1) to SM(m−1) are not to be accessed, the corresponding local bit lines LBL are in a floating state.

Next, the redundancy determination signal RDS corresponding to the row address RADT is activated by the redundancy determination circuit 12 at a time t1. Here, the time t1 is equal to a time point at which a redundancy determination time Tr is elapsed from the issuing of the active command ACT. In the example of FIG. 5, the row address RADT does not match the defective address, and the redundancy determination signal RDS is maintained at the low level as the mishit state (non-redundancy).

Thereafter, the bit line equalizing signal BLEQ is set to the low level due to the activation of the redundancy determination signal RDS at a time t2. Thereby, the precharge/equalize circuit 31 of the sense amplifier SA is inactivated, and the precharge operation of the global bit line GBL is cancelled. At the same time, the switch control signal SWC(m) of the redundant sub-mat SM(m) is inactivated to the low level by the redundancy determination signal RDS so that the local bit line LBL of the redundant sub-mat SM(m) is disconnected from the global bit line GBL. At this time point, the precharge operation of the local bit line LBL of the redundant sub-mat SM(m) is cancelled so as to be brought into a floating state. Since the sub-word line SWL in the redundant sub-mat SM(m) is maintained at the negative voltage VKK as a non-selected state, data of the memory cell MC of the redundant sub-mat SM(m) is not destroyed. In addition, setting the bit line equalizing signal BLEQ to the low level and setting the switch control signal SWC(m) to the low level are preferably completed before a later-described transition of the sub-word line SWL. Although these signals transition simultaneously in FIG. 5, the bit line equalizing signal BLEQ may transition, for example, after the switch control signal SWC(m) transitions.

Next, the sub-word line SWL to be accessed in the normal sub-mat SM(0) is driven to the positive voltage VPP at a time t3. Thereby, data stored in the memory cell MC to be accessed is read out to the local bit line LBL, a potential of the local bit line LBL rises to a predetermined level, and a potential of the global bit line GBL rises in the same manner through the corresponding hierarchical switch SW. Thereafter, the sense amplifier driving lines SAP and SAN are set to low and high levels respectively at a time t4, thereby activating the sense amplifier SA. As a result of an amplifying operation of the sense amplifier SA, if the data of the memory cell MC is "1", for example, both the potentials of the local bit line LBL and the global bit line GBL to be accessed rise to the power supply voltage VDL, and a potential of a complementary global bit line GBL that serves as a reference drops to the ground potential VSSSA.

Next, the sub-word line SWL to be accessed is returned to the negative voltage VKK at a time t5.

Subsequently, the sense amplifier driving lines SAP and SAN are returned to high and low levels that are potentials in the standby state respectively so that the sense amplifier SA is inactivated.

Next, the bit line equalizing signal BLEQ is set to the high level at a time t7. Thereby, since the precharge/equalize circuit 31 of the sense amplifier SA is activated, the global bit line GBL is precharged to the precharge voltage VBLP again. At this point, since the switch control signal SWC(0) of the normal sub-mat SM(0) is at the high level, the local bit line LBL is also precharged to the precharge voltage VBLP through the global bit line GBL and the hierarchical switch SW.

Thereafter, the switch control signal SWC(0) of the normal sub-mat SM(0) is inactivated to the low level at a time t8, and the local bit line LBL of the normal sub-mat SM(0) is disconnected from the global bit line GBL. At the same time, the switch control signal SWC(m) of the redundant sub-mat SM(m) is activated to the high level, the local bit line LBL of the redundant sub-mat SM(m) is connected to the global bit line GBL so as to return to the initial state (the precharge voltage VBLP). Thereby, an active period based on the active command ACT is finished so as to return to the standby state. In addition, the time t7 and the time t8 may match each other. If they match each other, when accessing data "0", for example, through the local bit line LBL as the access target, the local bit line LBL maintained at the low level (the ground potential VSSSA) is brought into a floating state. That is, transition timings of the switch control signals SWC(0) to SWC(m) may be freely determined respectively within a period after the time t5 at which the sub-word line SWL is brought into the inactive state or after the time t6 at which the sense amplifier SA is brought into the inactive state.

Next, FIG. 6 shows operation waveforms when the normal sub-mat SM(0) of the memory mat M of FIG. 3 is selected as the access target by the row address RADT and the redundancy determination signal RDS indicates a hit state (redundancy). Most of the operation waveforms shown in FIG. 6 are the same as those in FIG. 5, and thus different points from FIG. 5 will be mainly described below.

Since FIG. 6 shows potentials of the global bit line GBL and the local bit line LBL of the redundant sub-mat SM(m), the local bit line LBL is also maintained at the precharge voltage VBLP in the early point in addition to the global bit line GBL, as different from FIG. 5. This is because that the switch control signal SWC(m) of the redundant sub-mat SM(m) that has been activated to the high level allows the corresponding hierarchical switch SW to be in a connected state in the standby state. Thereafter, when the redundancy determination signal RDS is activated at the time t2 after the same operation as in FIG. 5, the row address RADT matches the defective address and therefore the redundancy determination signal RDS changes to the high level as the hit state.

Thereafter, the bit line equalizing signal BLEQ changes at the time t2 in the same manner as in FIG. 5 due to the redundancy determination signal RDS indicating the hit state. However, the switch control signals SWC(0) and SWC(m) change differently from those of FIG. 5. That is, the switch control signal SWC(0) of the normal sub-mat SM(0) is inactivated to the low level again, and the switch control signal SWC(m) of the redundant sub-mat SM(m) is maintained at the high level as an active state. As a result, the local bit line LBL of the normal sub-mat SM(0) is disconnected from the global bit line GBL, and the local bit line LBL of the redundant sub-mat SM(m) is connected to the global bit line GBL.

Next, the redundant sub-word line SWLR of the redundant sub-mat SM(m) is driven to the positive voltage VPP at the time t3, instead of driving the sub-word line SWL of FIG. 5. Thereby, data stored in a redundant memory cell RC of the redundant sub-mat SM(m) is read out to the corresponding local bit line LBL, a potential of the local bit line LBL rises to the predetermined level, and a potential of the global bit line GBL also rises in the same manner through the hierarchical switch SW. A subsequent amplifying operation is performed in the same manner as in FIG. 5. In addition, the levels of the switch control signals SWC(0) and SWC(m) are maintained after the time t8, as different from FIG. 5, thereby shifting to the standby state.

Next, FIG. 7 shows operation waveforms when the normal memory cell MC included in the redundant sub-mat SM(m) of the memory mat M of FIG. 3 is selected as the access target by the row address RADT in which both the mishit state (non-redundancy) and the hit state (redundancy) are indicated. Most of the operation waveforms shown in FIG. 7 are the same as those in FIG. 5 or 6, and thus different points from FIG. 5 or 6 will be mainly described below. In addition, FIG. 7 shows potentials of the global bit line GBL and the local bit line LBL similarly as in FIG. 6.

In FIG. 7, since the redundant sub-mat SM(m) is the access target specified by the row address RADT, the switch control signal SWC(0) of the normal sub-mat SM(0) is always maintained at the low level as an inactive state. The same goes for other normal sub-mat SM(1) to SM(m−1). Meanwhile, regarding an active state of the redundancy determination signal RDS of the redundancy determination circuit 12, two types of states of the mishit state (low level) and the hit state (high level) are shown overlapping each other at the time t1.

When the redundancy determination signal RDS indicates the mishit state, the sub-word line SWL of the redundant sub-mat(m) is driven at the time t3, and the same operation as in FIG. 5 is performed. On the other hand, when the redundancy determination signal RDS indicates the hit state, the redundant sub-word line SWLR of the redundant sub-mat(m) is driven at the time t3, and the same operation as in FIG. 6 is performed. Other operations are performed in the same manner as in FIG. 5 or 6, so description thereof will be omitted. In addition, the switch control signals SWC(0) and SWC(m) maintain their states in FIG. 7, thereby shifting to the standby state.

As described above, by employing the configuration and control of the embodiment, it is possible to reduce a circuit scale of the array region 10 and to prevent a decrease in access speed in the active operation. That is, the precharge/equalize circuit 31 provided in the sense amplifier SA is utilized not only in a precharge operation of the global bit line GBL but also in a precharge operation of the local bit line LBL through the hierarchical switch SW. In comparison with a configuration in which there are provided precharge circuits for respective local bit lines LBL corresponding to one global bit line GBL (the number of local bit lines LBL is larger than the number of global bit lines GBL), it is possible to remarkably reduce the circuit scale. Further, in the precharge operation (in the standby state), instead of turning on the hierarchical switches SW of all the sub-mats SM, only the hierarchical switches SW of the redundant sub-mat SM(m) are turned on, thereby suppressing consumption current. Further, after starting the active operation, only the hierarchical switches SW of the sub-mat SM to be accessed are additionally turned on in addition to the hierarchical switches SW of the redundant sub-mat SM(m), thereby suppressing the consumption current. Further, after starting the active operation, the hierarchical switches SW of the sub-mat SM to be accessed are turned on without waiting for the determination result of the redundancy determination circuit 12, it is possible to avoid a delay corresponding to the redundancy determination time, thereby improving the access speed.

Figure 8:
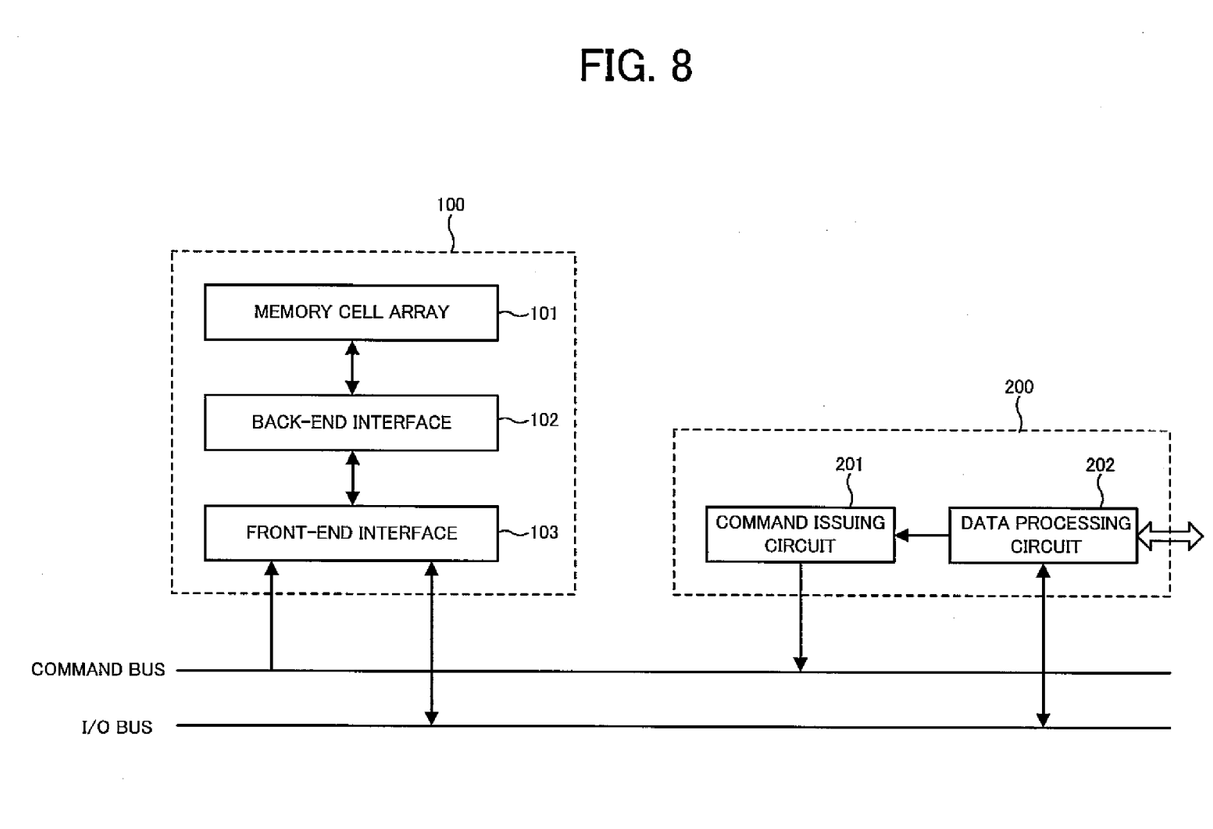
FIG. 8 is a diagram showing a configuration example of a data processing system comprising a semiconductor device having the configuration described in the embodiments and a controller controlling operations of the semiconductor device.

Next, a case in which the present invention is applied to a data processing system comprising a semiconductor device will be described. FIG. 8 shows a configuration example of the data processing system comprising a semiconductor device 100 having the configuration described in the embodiments and a controller 200 controlling operations of the semiconductor device 100.

The semiconductor device 100 is provided with a memory cell array 101, a back-end interface 102 and a front-end interface 103. The array region 10 of the embodiments is arranged in the memory cell array 101. The back-end interface 102 includes peripheral circuits of the array region 10. The front-end interface 103 has a function to communicate with the controller 200 through a command bus and an I/O bus. Although FIG. 8 shows only one semiconductor device 100, a plurality of semiconductor devices 100 may be provided in the system.

The controller 200 is provided with a command issuing circuit 201 and a data processing circuit 202, and controls operations of the system as a whole and the operation of the semiconductor device 100. The controller 200 is connected with the command bus and the I/O bus, and additionally has an interface for external connection. The command issuing circuit 201 sends commands to the semiconductor device 100 through the command bus. The data processing circuit 202 sends and receives data to and from the semiconductor device 100 through the I/O bus and performs processes required for the controlling. In addition, the semiconductor device 100 of the embodiments may be included in the controller 200 in FIG. 8.

The data processing system of FIG. 8 is, for example, a system implemented in electronics devices such as personal computers, communication electronics devices, mobile electronics devices and other industrial/consumer electronics devices.

The invention described in the embodiments can be widely applied to semiconductor devices having volatile or nonvolatile memory cells. Further, various circuit configurations can be employed in circuits included in the semiconductor device of the invention without being limited to the circuit configurations disclosed in the embodiments.

The invention can be applied to various semiconductor devices such as CPU (Central Processing Unit), MCU (Micro Control Unit), DSP (Digital Signal Processor), ASIC (Application Specific Integrated Circuit), and ASSP (Application Specific Standard Product) and the like. Further, the invention can be applied to various devices such as SOC (System on Chip), MCP (Multi Chip Package) and POP (Package on Package) and the like.

Further, transistors used in the embodiments are field-effect transistors (FETs) including various transistors such as not only MOS (Metal Oxide Semiconductor) transistors but also MIS (Metal-Insulator Semiconductor) transistors, TFT (Thin Film Transistor) and the like. Further, the device of the embodiments may include bipolar transistors. Furthermore, an N-channel type transistor (NMOS transistors) is a typical example of a first conductive type transistor, and a P-channel type transistor (PMOS transistor) is a typical example of a second conductive type transistor. Note that, in the embodiments, if the first conductive type transistor is replaced with the second conductive type transistor, the potential relation of control signals needs to be reversed in level.

The invention can be applied to devices based on various combinations or selections of the disclosure of the embodiments. That is, the invention covers various modifications which those skilled in the art can carry out in accordance with all disclosures including claims and technical ideas.

The invention claimed is:

1. A method for accessing data in a DRAM having hierarchical bit lines comprising:
    in a standby state:
        enabling precharge of a global bit line to a precharge voltage;
        enabling a redundant hierarchical switch to connect the global bit line to a redundant local bit line to which redundant memory cells are connected; and
        disabling a plurality of normal hierarchical switches to connect the global bit line to respective normal local bit lines to which normal memory cells are connected;
    upon activation:
        receiving an address corresponding to a selected normal memory cell;
        enabling a selected normal hierarchical switch to connect the global bit line to a selected normal local bit line to which the selected normal memory cell is connected;
        determining whether the address matches a defective address; and
        disabling precharge of a global bit line;
    if the address does not match the defective address:
        disabling the redundant hierarchical switch to disconnect the global bit line and the redundant local bit line; and
        enabling a selected normal word line connected to the selected normal memory cell;
    if the address matches the defective address:
        disabling the selected normal hierarchical switch to disconnect the global bit line and the selected normal local bit line; and
        enabling a selected redundant word line connected to a selected redundant memory cell.

2. The method as claimed in claim 1 wherein the plurality of normal hierarchical switches other than the selected normal hierarchical switch remain disabled following activation.

3. The method as claimed in claim 1 wherein the normal and redundant hierarchical switches are NMOS transistors.

4. The method as claimed in claim 3 wherein the normal and redundant hierarchical switches are enabled with a voltage supply Vpp higher than a sense amplifier positive power supply voltage Vdd.

5. The method as claimed in claim 4 wherein the normal and redundant word lines are enabled with the voltage supply Vpp.

6. The method as claimed in claim 3 wherein the normal and redundant hierarchical switches are disabled with a voltage supply Vkk lower than a sense amplifier negative power supply voltage Vss.

7. The method as claimed in claim 6 wherein the normal and redundant word lines are disabled with the voltage supply Vkk.

* * * * *